US007410090B2

(12) United States Patent
Cordes et al.

(10) Patent No.: US 7,410,090 B2
(45) Date of Patent: Aug. 12, 2008

(54) CONDUCTIVE BONDING MATERIAL FILL TECHNIQUES

(75) Inventors: Steven A. Cordes, Yorktown Heights, NY (US); Peter A. Gruber, Mohegan Lake, NY (US); John U. Knickerbocker, Monroe, NY (US); James L. Speidell, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/409,244

(22) Filed: Apr. 21, 2006

(65) Prior Publication Data

US 2007/0246511 A1 Oct. 25, 2007

(51) Int. Cl.
*B23K 31/02* (2006.01)

(52) U.S. Cl. .................. 228/180.1; 228/248.1; 228/256

(58) Field of Classification Search .................. None
See application file for complete search history.

(56) References Cited

U.S. PATENT DOCUMENTS 2,864,156 A * 12/1958 Cardy .................... 29/594
5,244,143 A 9/1993 Ference et al.
5,478,700 A * 12/1995 Gaynes et al. ............ 430/315
6,135,024 A * 10/2000 Higashida et al. .......... 101/123
6,454,154 B1 * 9/2002 Pedigo ....................... 228/33
2007/0057027 A1 * 3/2007 Bourrieres et al. ....... 228/248.1

FOREIGN PATENT DOCUMENTS

| FR | WO 01/49422 A1 | * | 7/2001 |
| FR | WO 02/19782 A1 | * | 3/2002 |
| FR | 2858254 | * | 7/2004 |
| FR | WO 2005/011877 A2 | * | 2/2005 |

* cited by examiner

*Primary Examiner*—Kiley Stoner
(74) *Attorney, Agent, or Firm*—Kevin M. Jordan; Jose Gutman; Fleit Gibbons Gutman Bongini & Bianco P.L

(57) ABSTRACT

A system, method, and apparatus of providing conductive bonding material into a plurality of cavities in a circuit supporting substrate is disclosed. The method comprises placing a fill head in substantial contact with a circuit supporting substrate. The circuit supporting substrate includes at least one cavity. A linear motion or a rotational motion is provided to at least one of the circuit supporting substrate and the fill head while the fill head is in substantial contact with the circuit supporting substrate. Conductive bonding material is forced out of the fill head toward the circuit supporting substrate. The conductive bonding material is provided into the at least one cavity contemporaneous with the at least one cavity being in proximity to the fill head.

20 Claims, 5 Drawing Sheets

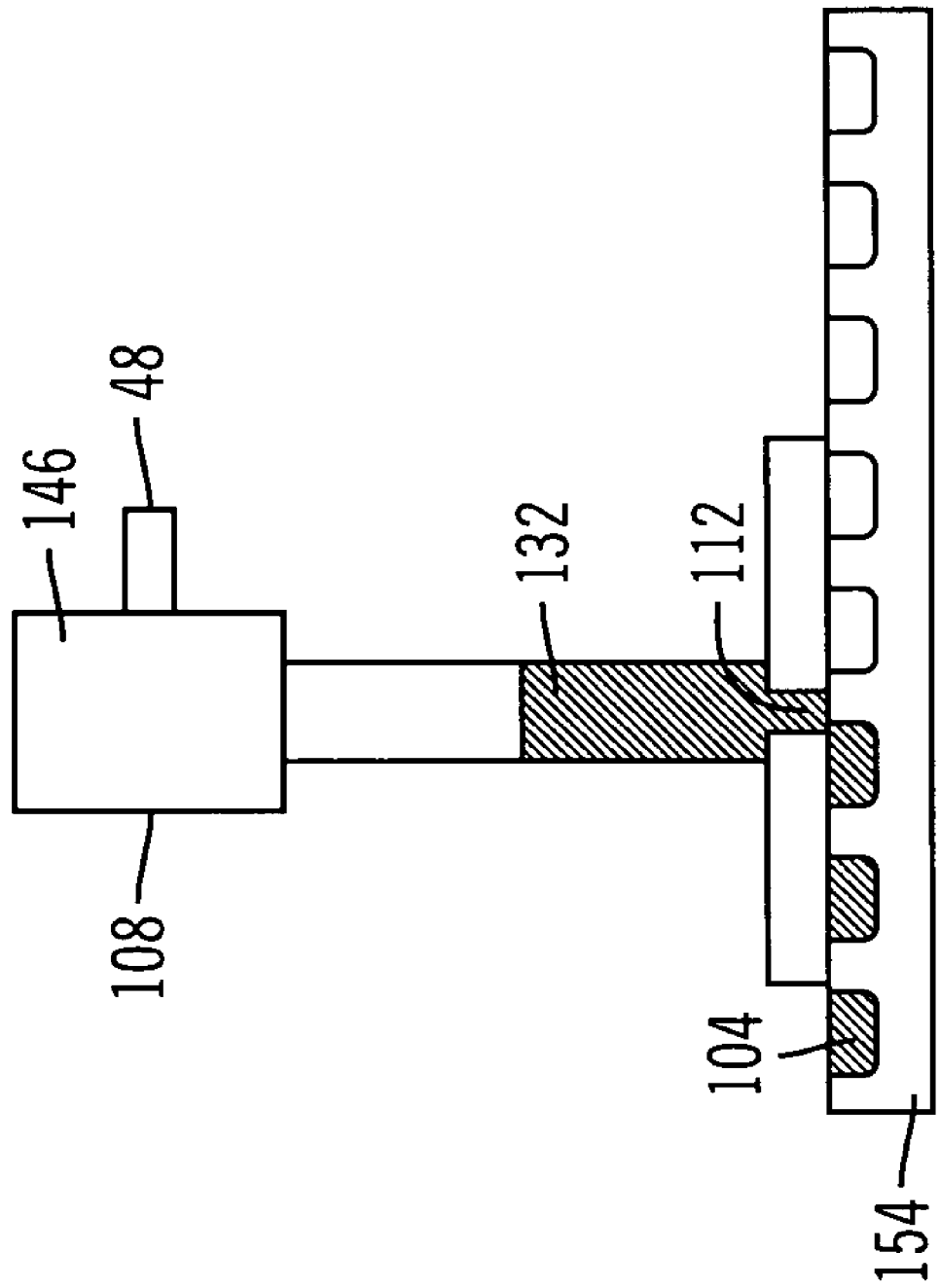

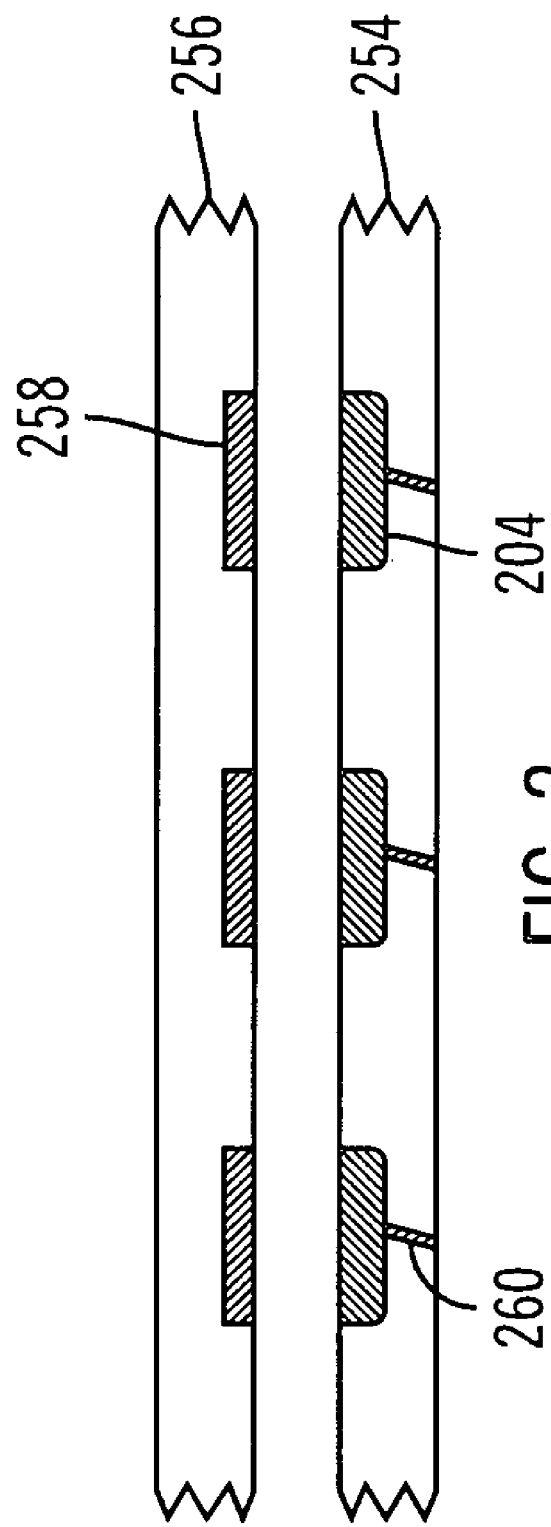
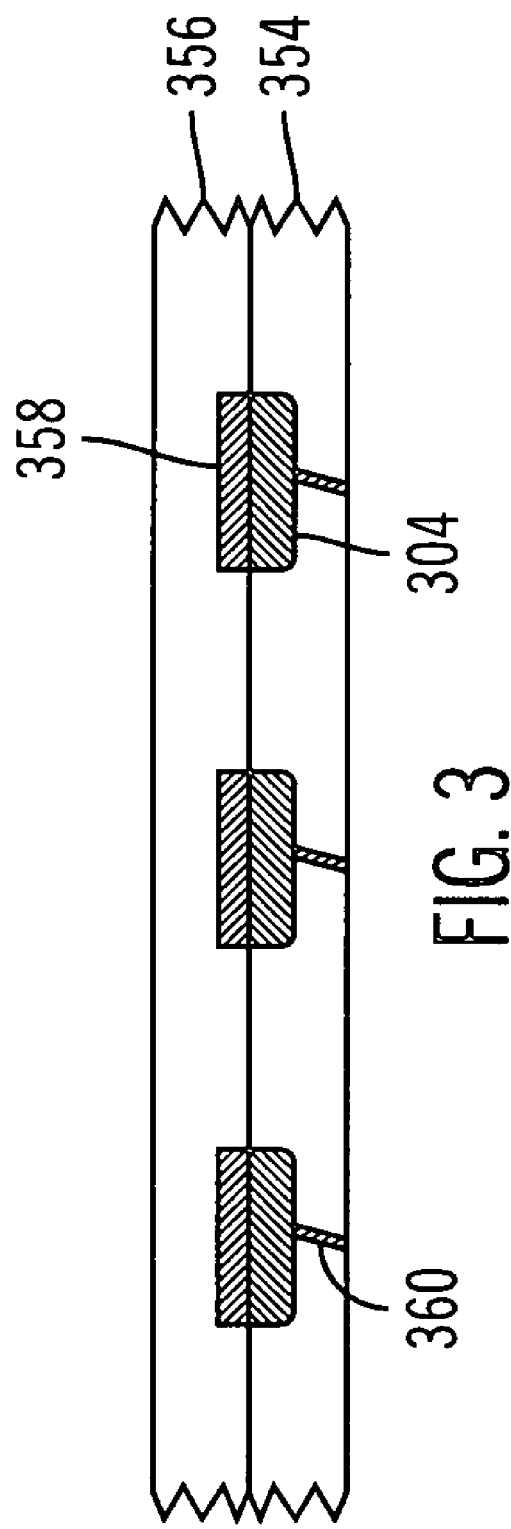

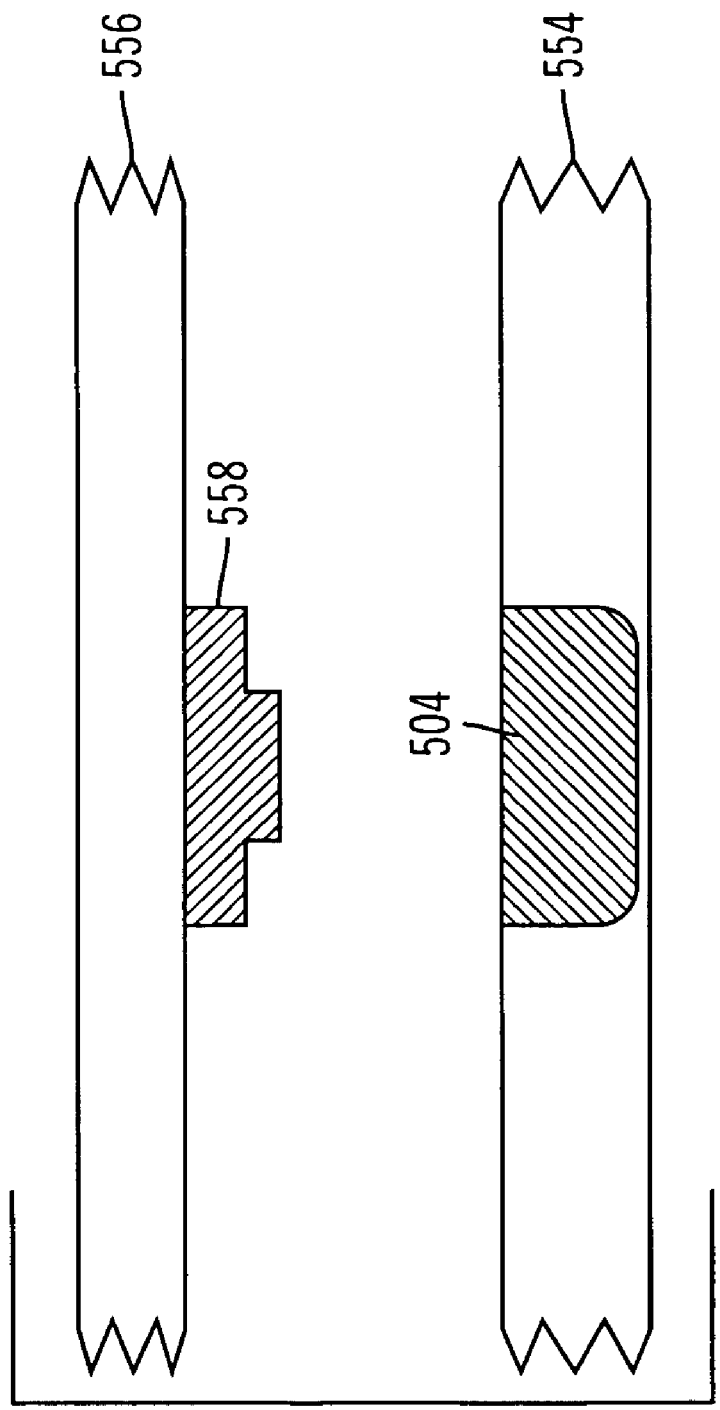
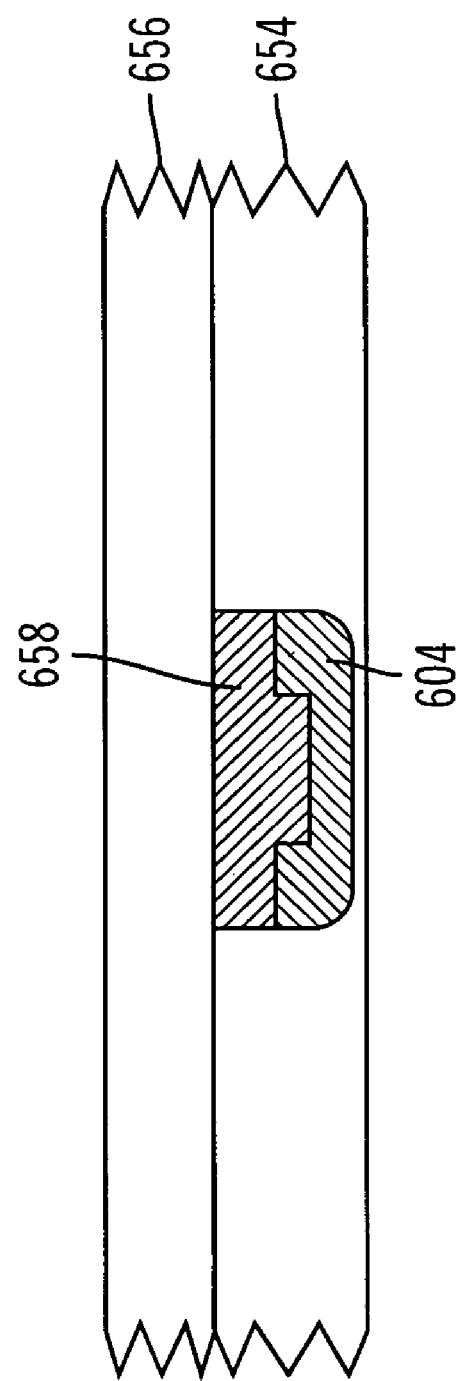
FIG. 5
FIG. 6

CONDUCTIVE BONDING MATERIAL FILL TECHNIQUES

CROSS REFERENCE TO RELATED APPLICATION

The present patent application is related to co-pending and commonly owned U.S. patent application Ser. No. 11/409,242, entitled "Universal Mold For Injection Molding Of Solder", U.S. patent application Ser. No. 11/409,232, entitled "Rotational Fill Techniques For Injection Molding Of Solder", and U.S. patent application Ser. No. 11/409,233, entitled "Fill Head For Injection Molding Of Solder", all filed on even date with the present patent application, their entire teachings of which being hereby incorporated by reference.

FIELD OF THE INVENTION

The present invention generally relates to the field of placement of conductive bonding material such as solder on electronic pads, and more particularly relates to placement of the conductive bonding material directly onto a circuit supporting substrate.

BACKGROUND OF THE INVENTION

In modern semiconductor devices, the ever increasing device density and decreasing device dimensions demand more stringent requirements in the packaging or interconnecting techniques of such devices. Conventionally, a flip-chip attachment method has been used in the packaging of IC chips. In the flip-chip attachment method, instead of attaching an IC die to a lead frame in a package, an array of solder balls is formed on the surface of the die. The formation of the solder balls is normally carried out by through-mask evaporation, solder paste screening, electroplating through photoresist, or injection molding of solder.

U.S. Pat. No. 5,244,143, which is commonly owned by International Business Machines Corporation, discloses the injection molded solder (IMS) technique and is hereby incorporated by reference in its entirety. One of the advantages of the IMS over other solder bumping techniques is that there is very little volume change between the molten solder and the resulting solder bump. The IMS technique utilizes a solder head that fills molds comprised of boro-silicate glass, molybdenum, silicon, polyimide, and the like that are wide enough to cover most single chip modules. A narrow wiper can be optionally provided behind the solder slit passes the filled holes of the mold to remove excess solder.

The IMS method for solder bonding is then carried out by applying a molten solder to a substrate in a transfer process. When smaller substrates, i.e., chip scale or single chip modules are encountered, the transfer step is readily accomplished since the solder-filled mold and substrate are relatively small in area and thus can be easily aligned and joined in a number of configurations. For instance, the process of split-optic alignment is frequently used in joining chips to substrates. The same process may also be used to join a chip-scale IMS mold to a substrate (chip) which will be bumped.

A problem common to the solder ball forming techniques discussed above and other techniques not discussed such as molten solder screening is with that a mold or die needs to be used. Current molds are limited to a rectangular form and have cavities arranged in a pattern specific to a pattern of a substrate design. In other words, current molds can only be used for a particular substrate design. Every new or change in design requires a new build of a mask or mold. This is true for existing technologies of plating and evaporation, as well as with IMS. In most cases, it is also preferable to produce multiple copies of masks or molds for throughput or redundancy. The costs for these new masks and molds will vary significantly, but are costly. This also drives delivery time, which can gate the delivery of final parts. This is especially costly in the event of a redesign, which can add several weeks onto the delivery schedule.

One problem with several of the mold materials, including borofloat, kapton, polyimide on glass, is that an existing infrastructure for building the molds does not exist. Unlike glass masks used in plating of solder, or metal masks used in evaporation of solder, both of which are readily available internationally, mold fabrication does not exist in mass production. While infrastructure does exist for some mold fabrication, such as molybdenum, this suffers from other disadvantages.

Another problem with using molds for depositing solder onto a substrate is that current molds are rectangular. Therefore, the mold and the solder head are moved linearly with respect to each other such that the cavities move perpendicular to a slit in the solder head thereby filling the cavities as they pass.

Therefore a need exists to overcome the problems with the prior art as discussed above.

SUMMARY OF THE INVENTION

Briefly, in accordance with the present invention, disclosed are a system and method for providing conductive bonding material into a plurality of cavities in a circuit supporting substrate. The method comprises placing a fill head in substantial contact with a circuit supporting substrate. The circuit supporting substrate includes at least one cavity. A linear motion or a rotational motion is provided to at least one of the circuit supporting substrate and the fill head while the fill head is in substantial contact with the circuit supporting substrate. Conductive bonding material is forced out of the fill head toward the circuit supporting substrate. The conductive bonding material is provided into the at least one cavity contemporaneous with the at least one cavity being in proximity to the fill head.

In another embodiment of the present invention a system of providing conductive bonding material into a plurality of cavities in a circuit supporting substrate is disclosed. The system includes at least one circuit supporting substrate and at least one conductive bonding material placement device. The at least one circuit supporting substrate includes at least one cavity. The at least one circuit supporting substrate provides conductive bonding material into the at least one cavity of the at least one circuit supporting substrate. The at least one conductive bonding material placement device comprises a fill head for guiding the conductive bonding material into the at least one cavity when the fill head is in substantial contact with the at least one circuit supporting substrate. The at least one conductive bonding material placement device also includes a conductive material reservoir mechanically coupled to the fill head for providing conductive bonding material to the fill head from the conductive material reservoir. The system further includes a means for providing one of linear and rotational motion to at least one of the fill head and the at least one circuit supporting substrate while the fill head is in substantial contact with the at least one circuit supporting substrate.

In yet a further embodiment of the present invention an integrated circuit is disclosed. The integrated circuit comprises a circuit supporting substrate and at least one electronic circuit disposed on the circuit supporting substrate. The integrated circuit also includes at least one cavity disposed on an outer surface of the circuit supporting substrate. The at least one cavity for receiving conductive bonding material during a soldering operation. The conductive bonding material in the at least one cavity forming an electrical contact with the at least one electronic circuit.

In yet a further embodiment of the present invention another integrated circuit is disclosed. The integrated circuit includes a circuit supporting substrate and at least one electronic circuit. The electronic circuit is disposed on the circuit supporting substrate. The integrated circuit also includes at least one contact pad disposed on the circuit supporting substrate. The at least one contact pad extends from an outer surface of the circuit supporting substrate. At least a portion of the at least one contact pad is for insertion into a corresponding cavity filled with conductive bonding material on a second circuit supporting substrate.

An advantage of the foregoing embodiments of the present invention is that a conductive bonding material such as solder is provided directly on a circuit supporting substrate. The cost of molds and the time delay experienced transferring material from a mold to a substrate is eliminated. The present invention can be implemented using current fill heads.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention.

FIG. 1 is a cross-sectional view of a fill head providing conductive bonding material directly to a circuit supporting substrate, according to an embodiment of the present invention;

FIGS. 2-3 are cross-sectional views of a circuit supporting substrate being coupled to another circuit supporting substrate having conductive bonding material in a plurality of cavities, according to an embodiment of the present invention;

FIGS. 5-6 are cross-sectional views of a circuit supporting substrate with a receiving pad extending from a surface of the circuit supporting substrate and being inserted into a cavity of another circuit supporting substrate comprising conductive bonding material, according to an embodiment of the present invention.

DETAILED DESCRIPTION

Figure 4:
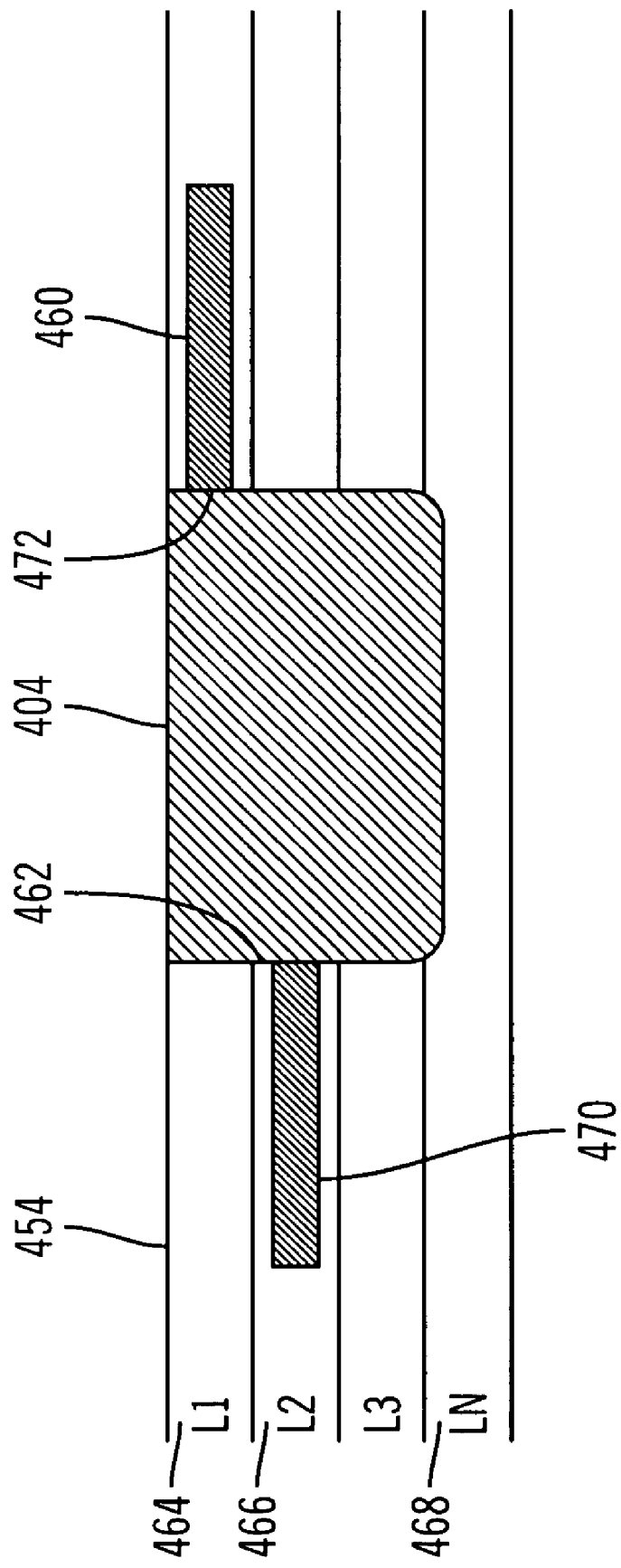
FIG. 4 is a cross-sectional view of a cavity in a circuit supporting substrate with electrical contacts within layers of the substrate terminating at the cavity, according to an embodiment of the present invention.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

The present invention, according to an embodiment, overcomes problems with the prior art by providing conductive bonding material such as solder directly to a circuit supporting substrate. The cost of molds and the time delay experienced transferring material from a mold to a substrate is eliminated. The present invention can be implemented using current fill heads. Another advantage is that solderable connections between two layers of the circuit supporting substrate can be created.

Exemplary Fill Technique for Directly Providing Solder to a Circuit Supporting Substrate FIG. 1 shows a cross-sectional view of a fill head 108 for use in directly providing solder to a circuit supporting substrate 154. Although solder is used throughout this disclosure as the material to be provided to the circuit supporting substrate 154, any conductive material such as conductive epoxy, solder pastes, adhesives impregnated with conductors (e.g. metal particles), or the like may be used. It should also be noted that the fill techniques of the foregoing embodiments are not limited to depositing conductive bonding material to an electrical circuit. The fill techniques can also be applied to other applications such a mechanical application, optical application, and the like. For example, the fill techniques of the present invention can be used to form mechanical joints. is the edge the cavities 104 pass under after they are filled with solder. As the cavities 104 pass under the trailing edge, the solder solidifies.

The solder within the cavities 104 is planar with respect to the surface of the circuit supporting substrate. Channeling a hot gas and a cool throughout the fill head 108 (at least in specific regions of the fill head 108) allows for more control over the temperature of the fill head 108 and the solder. For example, the heat/cool load from the mold 102 can change the temperature of the solder. Without the channeling of gases, the reservoir needs to be heated at a much higher temperature so that the solder does not solidify prematurely. In another embodiment, thermocouple probes (not shown) are situated in at least one the leading edge and/or the trailing edge of the fill head 108 to provide accurate temperature monitoring and feedback.

In one embodiment, a sacrificial layer (not shown) is deposited across the surface of the circuit supporting substrate 154. Cavities 104 are etched into the sacrificial layer (not shown) at locations where solder is required, e.g. receiving pads. Once the solder is provided to the cavities 104, the sacrificial layer (not shown) is removed by one or more techniques such as etching as would be understood by one of ordinary skill in the art. This process creates solder bumps on the receiving pads (not shown) of the circuit supporting substrate 154.

Coupling Two Circuit Supporting Substrates

FIGS. 2 and 3 show cross-sectional views of two circuit supporting substrates 254, 256. FIG. 3 shows the two circuit supporting substrates 354, 356 in close proximity to each other. As seen in FIG. 2, the first circuit supporting substrate 254 includes cavities 204 (also shown in FIG. 3 as cavities 304) that are filled with solder. In one embodiment, the cavities 204 are not all the same size. For example, a cavity can be 1 micron and another cavity can be 100 microns. One or more electrical contacts 260 (also shown in FIG. 3 as one or more electrical contacts 360) for creating electrical connections between the cavities 204 and another location either within the circuit supporting substrate 254, or on a different circuit supporting substrate (not shown), are also included. Although FIG. 2 and FIG. 3 show each cavity 204, 304 including an electrical contact 260, 360 alternative implementations can include any number of electrical contacts 260, 360 connected with any of the cavities 204, 304, as should be understood by those of ordinary skill in the art in view of the present discussion. A second circuit supporting substrate 256 includes receiving pads 258 (also shown in FIG. 3 as receiving pads 358). In one embodiment, the receiving pads 258 of the second circuit supporting substrate 254 are substantially flush with the circuit supporting substrate 256. As the first circuit supporting substrate 254 is heated to the reflow temperature of the solder, the solder will slightly raise, due to surface tension, above the surface of the first circuit supporting substrate 254. This allows for the receiving pads 258 and the solder to come into contact as the first and second circuit supporting substrates 254, 256 are brought into close proximity of each other, as illustrated in FIG. 3. The solder can then be solidified thereby creating a bonded electrical connection between the first and second substrates 254, 256.

Creating Interlayer Connections in a Circuit Supporting Substrate

FIG. 4 shows a cross sectional view of a circuit supporting substrate 454. In particular, FIG. 4 shows electrical contacts 460, 470 at two layers 464, 466 of the circuit supporting substrate 454. The electrical contacts 460, 470, shown in this example, do not extend to other layers, such as layer LN 468. However, it will be well understood by those of ordinary skill in the art in view of the present discussion that these electrical contacts 460, 470 could be extended to other layers of the circuit supporting substrate 454, within the scope of the present invention. As will be discussed in more detail below, the circuit supporting substrate 454 includes one or more cavities 404. Also, one or more electrical contacts 460, 470 are included in the circuit supporting substrate 454. The electrical contacts 460, 470, in one embodiment, are situated at different levels 464, 466 of the circuit supporting substrate 454. For example, FIG. 4 shows a first electrical contact 460 in the first layer 464 of the circuit supporting substrate 454 intersecting the cavity 404. A second electrical contact 470 is situated in a second layer 466 of the circuit supporting substrate 454 intersecting the cavity 404. In one embodiment, the electrical contacts 460, 470 terminate at a side wall 462, 472 of the cavity 404. This creates an electrical connection between the cavity 404 and the electrical contacts 460, 470. In another embodiment, one or more electrical contacts terminate in, and are embedded within, the cavity 404.

Another Embodiment for Coupling Two Circuit Supporting Substrates

FIGS. 5-6 show a cross sectional view of two circuit supporting substrates 554, 556. A first circuit supporting substrate 554 includes a cavity 504 with solder that has been directly provided by a fill head (not shown). A second circuit supporting substrate 556 includes a receiving pad 558 that extends outwardly from the second circuit supporting substrate 556. As the circuit supporting substrates 554, 556 are brought into close proximity with each other, the protruding receiving pad 558 enters into the solder within the cavity 504. When the circuit supporting substrates 554, 556 are coupled to one another, as shown in FIG. 6, the protruding receiving pad 558 of the second circuit supporting substrate 556 has entered into the cavity 504 of the first circuit supporting substrate 554. This ensures that proper contact between the receiving pad 558 and the solder occurs. For example, the cavity 504 may not have been filled with enough solder to contact a conventional receiving pad.

Figure 7:
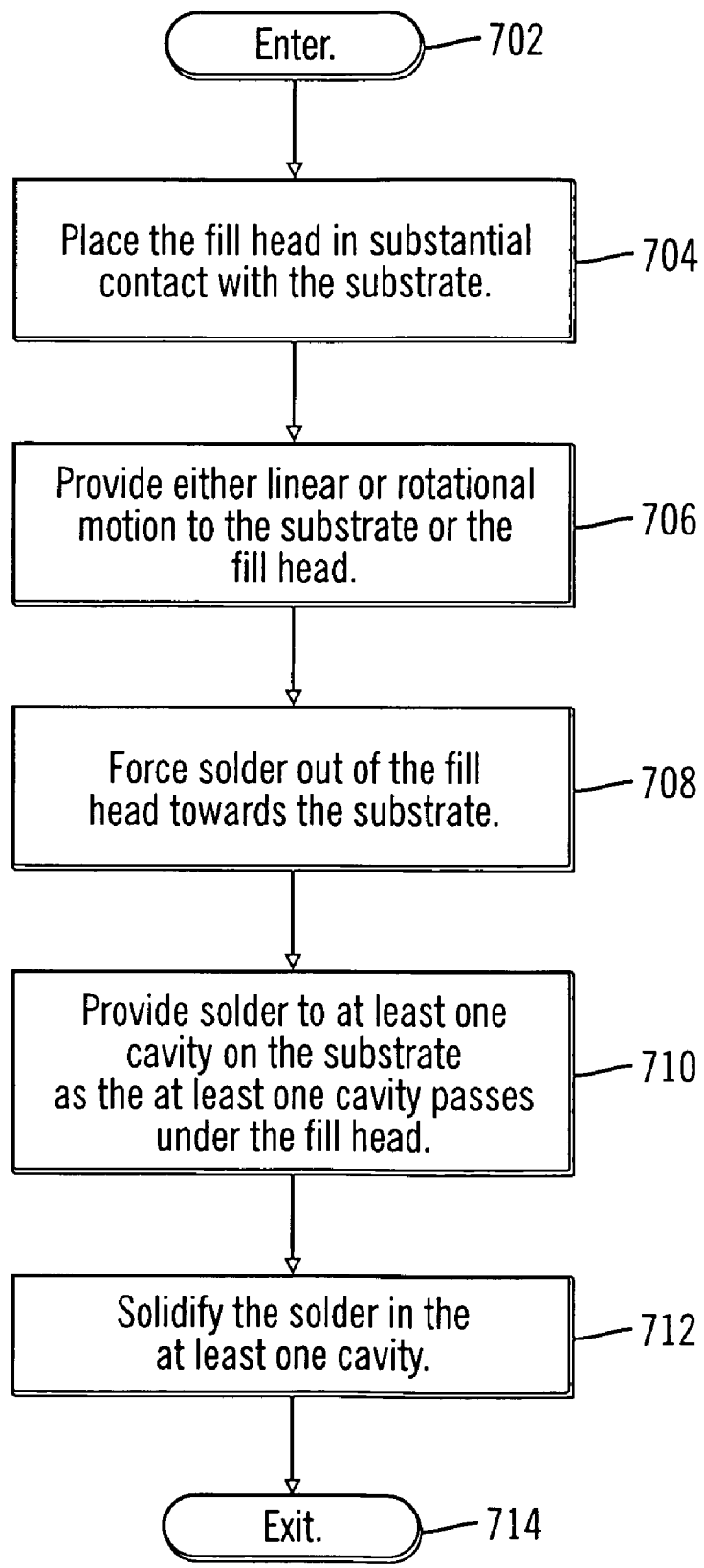
FIG. 7 is an operational flow diagram illustrating an exemplary process of directly providing conductive bonding material to a circuit supporting substrate, according to an embodiment of the present invention.

Exemplary Process of Directly Filling a Circuit Supporting Substrate with Solder FIG. 7 is an operational flow diagram showing the exemplary process of directly providing conductive bonding material such as solder to a circuit supporting substrate. The operational flow diagram of FIG. 7 begins at step 702 and flows directly to step 704. The fill head, at step 704, is placed in substantial contact with the circuit supporting substrate. Linear or rotational motion, at step 706, is provided to either the circuit supporting substrate and/or the fill head. Solder, at step 708, is forced out of the fill head towards the circuit supporting substrate. For example, a back pressure is applied to a reservoir forcing the solder to flow through a channel and out of the fill head via a delivery slot.

Solder, at step 710, is provided to at least one cavity on the circuit supporting substrate as the at least one cavity passes under the fill head. In one embodiment, an optional fill blade (not shown) is included on the fill head, which exhibits a squeegee effect and guides the molten solder down into the cavity. In another embodiment a bottom surface of the fill head is flat enough and smooth enough to exhibit a squeegee effect across the mold. The solder, at step 712, is solidified within the cavity of the circuit supporting substrate. For example, a cool gas is transferred from an external reservoir (not shown) to a gas channel within the fill head. This causes solder in the at least one cavity to solidify as the cavities with the solder passes under an edge of the fill head channeling the cool gas. The control flow then exits at step 114.

Non-Limiting Examples

The foregoing embodiments of the present invention are advantageous because they provide conductive bonding material such as solder directly to a circuit supporting substrate. The cost of molds and the time delay experienced transferring material from a mold to a substrate is eliminated. The present invention can be implemented using current fill heads. Another advantage is that solderable connections between two or more layers of the circuit supporting substrate can be created.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method of providing conductive bonding material into a plurality of cavities in a circuit supporting substrate, the method comprising:

placing a fill head in substantial contact with a circuit supporting substrate, wherein the circuit supporting substrate includes at least one cavity;

providing one of a linear motion and a rotational motion to at least one of the circuit supporting substrate and the fill head while the fill head is in substantial contact with the circuit supporting substrate;

forcing conductive bonding material out of the fill head toward the circuit supporting substrate;

providing the conductive bonding material into the at least one cavity contemporaneous with the at least one cavity being in proximity to the fill head; and bringing a second circuit supporting substrate in close proximity to the circuit supporting substrate, wherein at least one receiving pad on the second circuit supporting substrate substantially contacts the conductive bonding material of the at least one cavity, wherein the at least one receiving pad extends from a surface of the second circuit supporting substrate and at least a portion of the at least one receiving pad is inserted at least partially into the at least one cavity.

2. The method of claim 1, further comprising:
heating the conductive bonding material in the at least one cavity to a reflow temperature thereby raising the conductive bonding material above the at least one cavity.

3. The method of claim 1, wherein the at least one cavity is formed by:
providing a temporary layer across an outer surface of a circuit supporting substrate that is to receive conductive bonding material; and
etching at least one cavity into the temporary layer for receiving the conductive bonding material, wherein the temporary layer is removed after the conductive bonding material is provided into the at least one cavity thereby leaving a conductive bonding material bump on the circuit supporting substrate.

4. The method of claim 1, wherein the at least one cavity is dimensionally configured differently than another cavity on the circuit supporting substrate.

5. The method of claim 1, wherein the conductive bonding material comprises solder.

6. A method of providing conductive bonding material into a plurality of cavities in a circuit supporting substrate, the method comprising:
placing a fill head in substantial contact with a circuit supporting substrate, wherein the circuit supporting substrate includes at least one cavity;
providing one of a linear motion and a rotational motion to at least one of the circuit supporting substrate and the fill head while the fill head is in substantial contact with the circuit supporting substrate;
forcing conductive bonding material out of the fill head toward the circuit supporting substrate;
providing the conductive bonding material into the at least one cavity contemporaneous with the at least one cavity being in proximity to the fill head;
bringing a second circuit supporting substrate in close proximity to the circuit supporting substrate, wherein at least one receiving pad on the second circuit supporting substrate substantially contacts the conductive bonding material of the at least one cavity; and
filling the at least one cavity such that at least one electrical contact in one or more layers of the at least one cavity is brought into electrical contact with the conductive bonding material in the at least one cavity, wherein the at least one electrical contact tenninates at a sidewall of the at least one cavity.

7. The method of claim 6, further comprising:
bringing a second circuit supporting substrate in close proximity to the circuit supporting substrate, wherein at least one receiving pad on the second circuit supporting substrate substantially contacts the conductive bonding material of the at least one cavity.

8. The method of claim 7, wherein the at least one receiving pad extends from a surface of the second circuit supporting substrate and at least a portion of the at least one receiving pad is inserted at least partially into the at least one cavity.

9. The method of claim 6, further comprising:
heating the conductive bonding material in the at least one cavity to a reflow temperature thereby raising the conductive bonding material above the at least one cavity.

10. The method of claim 6, wherein the at least one cavity is formed by:
providing a temporary layer across an outer surface of a circuit supporting substrate that is to receive conductive bonding material; and
etching at least one cavity into the temporary layer for receiving the conductive bonding material, wherein the temporary layer is removed after the conductive bonding material is provided into the at least one cavity thereby leaving a conductive bonding material bump on the circuit supporting substrate.

11. The method of claim 6, wherein the at least one cavity is dimensionally configured differently than another cavity on the circuit supporting substrate.

12. The method of claim 6, wherein the conductive bonding material comprises solder.

13. The method of claim 6, further comprising:
channeling a first gas about a first edge of the fill head, the first gas having a temperature above a melting point of the conductive bonding material thereby maintaining the conductive bonding material in a molten state as the conductive bonding material and the at least first gas are in close proximity to one another; and
channeling a second gas about a second edge of the fill head, the second gas having a temperature below the melting point of the conductive bonding material thereby substantially solidifying the conductive bonding material within the at least one cavity as the at least one cavity passes under the second region of the fill head with the at least second gas.

14. A method of providing conductive bonding material into a plurality of cavities in a circuit supporting substrate, the method comprising;
placing a fill head in substantial contact with a circuit supporting substrate, wherein the circuit supporting substrate includes at least one cavity;
providing one of a linear motion and a rotational motion to at least one of the circuit supporting substrate and the fill head while the fill head is in substantial contact with the circuit supporting substrate;
forcing conductive bonding material out of the fill head toward the circuit supporting substrate;
providing the conductive bonding material into the at least one cavity contemporaneous with the at least one cavity being in proximity to the fill head;
bringing a second circuit supporting substrate in close proximity to the circuit supporting substrate, wherein at least one receiving nad on the second circuit supporting substrate substantially contacts the conductive bonding material of the at least one cavity;
channeling a first gas about a first edge of the fill head, the first gas having a temperature above a melting point of the conductive bonding material thereby maintaining the conductive bonding material in a molten state as the conductive bonding material and the at least first gas are in close proximity to one another; and
channeling a second gas about a second edge of the fill head, the second gas having a temperature below the melting point of the conductive bonding material thereby substantially solidifying the conductive bonding material within the at least one cavity as the at least one cavity passes under the second region of the fill head with the at least second gas.

15. The method of claim 14, further comprising:
bringing a second circuit supporting substrate in close proximity to the circuit supporting substrate, wherein at least one receiving pad on the second circuit supporting substrate substantially contacts the conductive bonding material of the at least one cavity.

16. The method of claim 15, wherein the at least one receiving pad extends from a surface of the second circuit supporting substrate and at least a portion of the at least one receiving pad is inserted at least partially into the at least one cavity.

17. The method of claim 14, wherein the at least one cavity is formed by:
providing a temporary layer across an outer surface of a circuit supporting substrate that is to receive conductive bonding material; and
etching at least one cavity into the temporary layer for receiving the conductive bonding material, wherein the temporary layer is removed after the conductive bonding material is provided into the at least one cavity thereby leaving a conductive bonding material bump on the circuit supporting substrate.

18. The method of claim 14, wherein the at least one cavity is dimensionally configured differently than another cavity on the circuit supporting substrate.

19. The method of claim 14, wherein the conductive bonding material comprises solder.

20. The method of claim 14, further comprising:
filling the at least one cavity such that at least one electrical contact in one or more layers of the at least one cavity is brought into electrical contact with the conductive bonding material in the at least one cavity, wherein the at least one electrical contact terminates at a sidewall of the at least one cavity.

* * * * *